US008498850B2

(12) United States Patent
Booch et al.

(10) Patent No.: US 8,498,850 B2
(45) Date of Patent: Jul. 30, 2013

(54) LOOKING GLASS: A HYBRID SIMULATION SYSTEM TO MODEL CASCADING EVENTS WITHIN A BLACK BOX SYSTEM

(75) Inventors: Ernest G. Booch, Littleton, CO (US); Anni R. Coden, Riverdale, NY (US); David W. Levine, New York, NY (US); Michael A. Tanenblatt, Nassau, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/618,437

(22) Filed: Sep. 14, 2012

(65) Prior Publication Data

US 2013/0085740 A1   Apr. 4, 2013

Related U.S. Application Data

(63) Continuation of application No. 13/251,892, filed on Oct. 3, 2011.

(51) Int. Cl.
*G06G 7/48* (2006.01)
(52) U.S. Cl.
USPC .................................. 703/6; 706/12; 702/183
(58) Field of Classification Search
USPC ............. 703/6, 11; 706/12; 600/365; 705/35; 702/183, 186
See application file for complete search history.

(56) References Cited

U.S. PATENT DOCUMENTS

| 6,167,362 | A  | * | 12/2000 | Brown et al. ................... 703/11 |
| 6,963,827 | B1 | * | 11/2005 | Elyea et al. ....................... 703/6 |
| 6,986,125 | B2 |   | 1/2006 | Apuzzo et al. |
| 2003/0046029 | A1 | * | 3/2003 | Wiener et al. ................. 702/186 |
| 2005/0049834 | A1 | * | 3/2005 | Bottomfield .................. 702/183 |
| 2009/0018811 | A1 |   | 1/2009 | Paradkar et al. |
| 2010/0138368 | A1 | * | 6/2010 | Stundner et al. ................ 706/12 |
| 2011/0098548 | A1 | * | 4/2011 | Budiman et al. .............. 600/365 |
| 2011/0184844 | A1 | * | 7/2011 | Parsons et al. .................. 705/35 |

OTHER PUBLICATIONS

Warren, S.-et al.; "A proposed information architecture for telehealth system interoperability"; Toward an Electronic Patient Record;Conf & Expos(TERR'99);pp. 187-194;vol. 2;1999.
Warren, S.-et al.; A proposed information architecture for telehealth system interoperability; First Joint BNES/EMBS Conf; IEEE Engrg in Med&Biology; 21st Conf, 2 Vol; 1999.
Prehofer, C.; "Plug-and-Play Composition of Features and Feature Interactions with Statechart Diagrams"; In Proceedings of FIW; pp. 43-58; 2003.

* cited by examiner

*Primary Examiner* — Kandasamy Thangavelu
(74) *Attorney, Agent, or Firm* — Scully, Scott, Murphy & Presser, P.C.; Anne V. Dougherty, Esq.

(57) ABSTRACT

A hybrid simulation system to model cascading events within a black box system may include a tessellated field operable to allow a plurality of black box components to execute on a processor and communicate without needing a direct connection between the black box components. The black box components have transfer functions defined over a common coordinate system and time.

17 Claims, 7 Drawing Sheets

LOOKING GLASS: A HYBRID SIMULATION SYSTEM TO MODEL CASCADING EVENTS WITHIN A BLACK BOX SYSTEM

RELATED APPLICATIONS

This application is a continuation of U.S. application Ser. No. 13/251,892, filed Oct. 3, 2011.

FIELD

The present application relates generally to computers, and computer applications, and more particularly to a hybrid simulation system to model cascading events within a black box system.

BACKGROUND

Many task-oriented systems can be described as a system of systems. Each such subsystem (i.e., a component of a system of systems) performs a specific set of functions of arbitrary complexity within its specified hardware and software configuration. A system of systems can then be specified by stipulating connections between inputs and outputs of the components. It is assumed that the relevant inputs and outputs of connecting components can be specified within a common semantic framework, and then for example, implemented with a translational layer external to each component. However, there are several other challenges in building a system of systems: synchronization between the components, modularity (i.e., the ability to swap one component in for another one without modifying the overall system of systems architecture and execution) and the ability to add components to build a new system of systems without having to modify any of the components. An additional challenge arises when the components are "black boxes."

BRIEF SUMMARY

A hybrid simulation system for modeling cascading events within a black box system, in one aspect, may include a tessellated field representing coordinates for the black box system and operable to allow a plurality of black box components to execute on a processor and communicate without needing a direct connection between the black box components. A choreographer module may be operable to manage and synchronize running of the plurality of black box components via the tessellated field over time. The black box components have transfer functions defined over a common coordinate system and time.

A method of modeling cascading events within a black box system, in one aspect, may include receiving a scenario description. The scenario description may include coordinates of the black box system and specification of a plurality of black box components associated with the black box system. The method may also include building a tessellated field associated with the black box system based on the received scenario description. The tessellated field represents coordinates for the black box system. The method may further include running a simulation scenario by executing the plurality of black box components over a simulation time period, the black box components having transfer functions defined over a common coordinate system and time. The black box components communicate only through the tessellated field without needing a direct connection between the black box components. The method may further include updating the tessellated field with results of the simulation.

In another aspect, a method of modeling cascading events within a black box system may include receiving a scenario description. The method may further include configuring a tessellated field representing coordinates of the black box system based on the scenario description and specifications of a plurality of black box components associated with the black box system. The method may also include running a simulation scenario by executing the plurality of black box components, the black box components having transfer functions defined over a common coordinate system and time, the black box components communicating only through the tessellated field without needing a direct connection between the black box components. The running a simulation scenario in one aspect, may include at least the following: initializing a clock to time T; retrieving data available from one or more of the plurality of black box components; resolving conflict, if any, in the received data; storing the data in the tessellated field; performing one or more analytic functions, if any, associated with the one or more of the plurality of black box components from which the data is retrieved; updating the tessellated field with one or more results of the performed one or more analytic functions; applying one or more rules associated with the one or more of the plurality of black box components from which the data is retrieved; updating the tessellated field with one or more results of the applying of the one or more rules; executing one or more user actions, if any, received from a user via a computer user interface module; updating the tessellated field with one or more results of the executing of the one or more user actions; incrementing time T by a time unit; and repeating the steps of retrieving, resolving, storing, performing, updating, applying, updating, executing, updating and incrementing until simulation is ended.

A computer readable storage medium storing a program of instructions executable by a machine to perform one or more methods described herein also may be provided.

Further features as well as the structure and operation of various embodiments are described in detail below with reference to the accompanying drawings. In the drawings, like reference numbers indicate identical or functionally similar elements.

DETAILED DESCRIPTION

Figure 1:
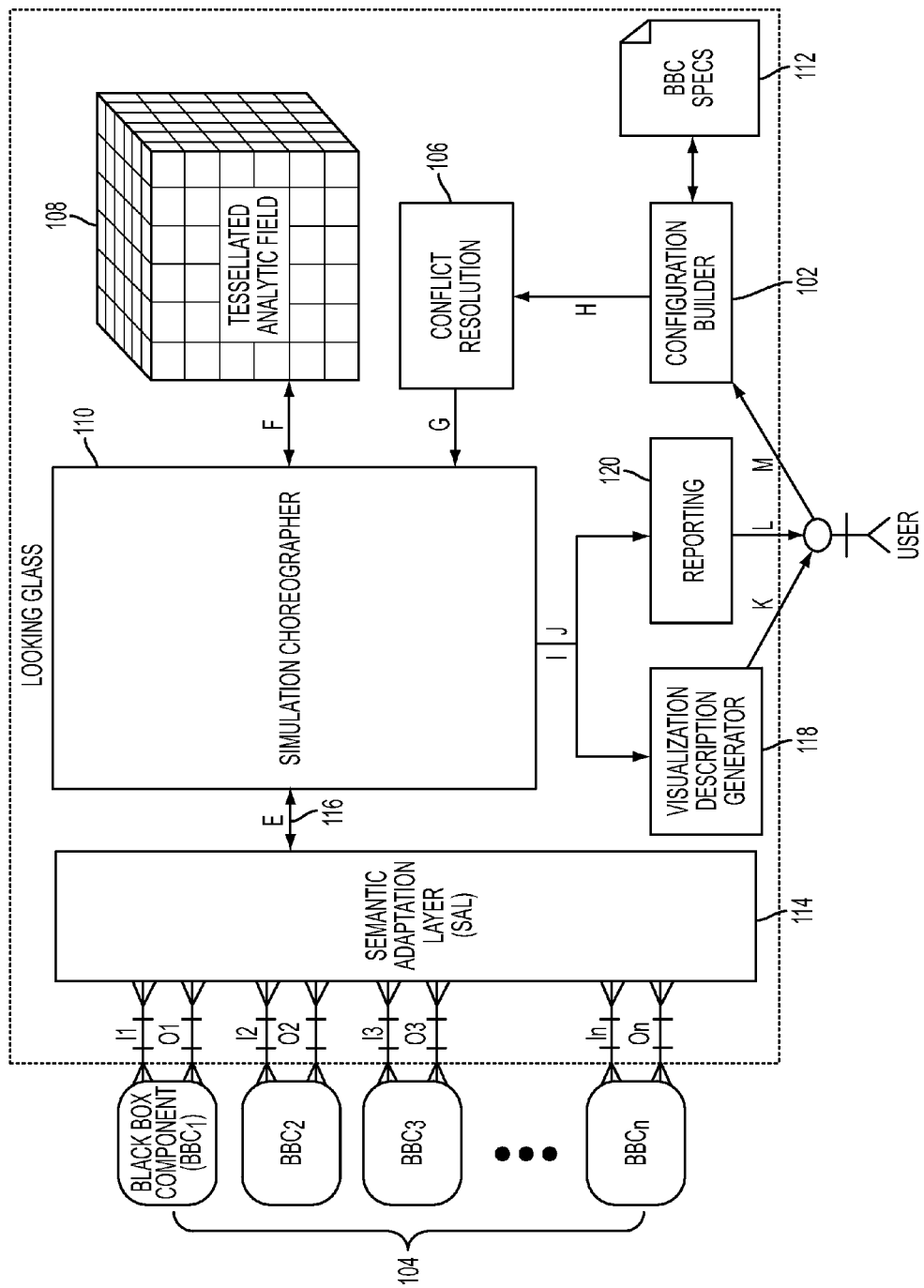
FIG. 1 illustrates an example of a system using a methodology of the present disclosure in one embodiment.

The methodology and system of the present disclosure in one embodiment may provide for building and executing a black box system, for instance, without the need to explicitly connect the black boxes to one another. In addition, the capability may be provided to modify data during execution, detect anomalous behavior and issue alerts using, for instance, tessellated fields such as semantic tessellated analytical fields.

In science and engineering field of technology, a black box is defined as a device, system or object which can be viewed solely in terms of its input, output and transfer characteristics without any knowledge of its internal workings. Transfer characteristics refer to a mathematical representation in terms of spatial and/or temporal frequency, of the relation between the input(s) and output(s). The present disclosure modifies the definition of a black box. In the present disclosure, a black box is defined as a device, system or object which can be viewed solely in terms of its input(s) and output(s) and whose transfer characteristics can be observed and recorded (e.g., via a table) by execution of the black box, but for which a mathematical representation is not known and may not exist. The transfer characteristics in the present disclosure may be represented in terms of temporal and spatial coordinate system. In other embodiments, the transfer characteristics may be represented in terms of temporal and another coordinate system.

A few examples of black boxes include: a weather model, traffic model, train schedule, road network with associated attributes (e.g., number of lanes, direction of traffic, passable/not-passable), people behavior models, sensors, and others.

For black boxes to be able to interact with each other, their inputs and outputs are defined using a common semantic model. In its simplest form, a semantic model defines the units in which inputs and outputs of black boxes are defined. The complexity of the necessary semantic model depends on the complexity of the black boxes and their inputs and outputs within a system.

In the present disclosure in one embodiment, a black box component (BBC) is defined to be a black box, whose input(s) and output(s) can be described in a common semantic model and whose temporal transfer characteristics can be described in a coordinate system C. For each black box component, the time range and the extent of the coordinates C for which its execution is defined are specified. A black box component whose output(s) are not dependent on time are assumed to be valid for all possible time points, a black box component whose output(s) are not dependent on C are assumed to be valid for all possible C and a black box component whose output(s) are neither dependent on time nor on C are assumed to be valid for all points of time and for all possible values of C. BBCs can describe both time continuous and time discrete systems. In one embodiment of the present disclosure, each BBC can execute in its optimal environment, with the constraint that inputs and outputs are accessible via a common protocol.

In one embodiment of the present disclosure, an adaptive black box component (ABBC) is defined as a black box component which provides an application program interface (API) to modify any data it uses and which is able to then take the modified data into account to compute its output. An example might be a traffic routing ABBC that allows, via an API, for its road network to be altered (e.g., road closing).

A methodology and/or system of the present disclosure in one embodiment allows for integration and execution of one or more black box components (also referred to as models), synchronizing the execution of the black box components, for instance, without needing to have the black box components connect directly to one another or even be aware of one another. A system and/or methodology of the present disclosure may be referred to herein interchangeably as "Looking Glass".

The following provides an example of a black box and an example application of the methodology of the present disclosure in one embodiment. It should be noted that the application of the methodology is not limited to only the described example; rather, the methodology of the present disclosure may be applicable to any black box or like components.

An example scenario of a black box system of systems:

A city is a dynamic interdependent physical environment shaped by its people, their actions and behaviors; some of these are regulated while others are stochastic. City officials and citizens alike have to be able to plan and act under uncertainty—they must be able to address the countless scenarios describing different situations that might arise. By "situation" it is meant the "combination of circumstances at any given time" and "conditions or positions people find themselves in". A scenario is therefore a complex sequence of ever changing situations, triggered by one or more events. A methodology of the present disclosure in one embodiment enables, as an example of its practical application, the discovery of a city's vulnerabilities in a scenario and the exploration of alternative resolutions and their side effects. It may serve as a tool for enabling city officials to bridge the silos defined by people, processes and organizations and may provide a decision support framework that can be used to discover interdependencies between a city's infrastructure elements, its protocols (procedures) and its people's actions over time. It may serve as a tool for preparedness planning for natural and man-made threats, providing visualization of scenarios as they unfold, allowing observation and measurement of the effects of ad-hoc decisions. In one embodiment of the present disclosure, a dynamic data driven system (also referred to as Looking Glass) is provided where the data can be interactively manipulated, for example, with a human-in-the-loop module during simulation.

The following is an example of the simulation and interactivity that can be executed with Looking Glass. The particular circumstance in this example is the evacuation of people and equipment from a subway station in a metropolitan area. The physical area of interest is a subway station and its surroundings. One of the components (an (A)BBC) in the system is a model of the topology of station, e.g., number, size and location of the platforms, stairs and exits, with geographic coordinates typically—but not limited to—being specified using longitude, latitude, and altitude. In addition, properties can be associated with this topography such as whether the space is passable. Another component models how individual people move, (walk, run, ascend/descend stairs), depending on their associated physical and behavioral characteristics. A scenario description describes the situation and how it unfolds over time, encoded by sets of rules that are executed as a result of simulator state (or user action) and subsequently provide feedback to one or more models (components) through the one or more model's API's. The scenario description can be changed. Each component can be seeded with some initial conditions, such as the number of people in the subway station and their characteristics and their location at the beginning of the simulation. An example of information encoded in the scenario description is that certain people move towards the platform, whereas others move towards the exit. As the simulation proceeds, one can observe where people are at any given time (which clearly depends on each person's characteristics). The simulator (choreographer) queries the components at each time step and executes rules based on the information from those components and the information from previous cycles of the simulation. At any point, a user can interactively choose to change values associated with the simulation (e.g., the location of an object), or can cause a rule to be executed even if its preconditions are not met. For example, the user can select to cause an event that is a "chemical bomb explosion" at some location in the subway station. Assuming that the people model has an input that considers air quality, the people in the station now all adjust their movements towards the exits. Just as in a real life situation, the user can then dynamically change the topography of the subway station by invoking a function from the GUI which makes an area in the subway station impassable. In particular, the model of the topography of the subway station contains information about each location being passable or not.

In general, the key performance parameters may be the time, resources and cost of resolving an incident, both financial as well as in terms of the health, safety and happiness of the population.

Most operations within a physical environment (e.g., a city, region, state) can be described with a system of (adaptive) black box components. Examining the inputs and outputs of (adaptive) black box components, one can infer which components may have a direct influence on each other. The value ranges for which the appropriate input(s) and output(s) of two (A)BBCs overlap may be determined, e.g., when each (A)BBC has only one input and one output. Further, such value ranges may be determined in more complex scenarios, e.g., when either a (A)BBC has more than one input and/or output and/or when more than two (A)BBCs can have direct influence on each other, in effect creating potentially cascading events across multiple (A)BBCs. A system and/or methodology in one embodiment of the present disclosure may determine the value ranges of input(s) and output(s) (as functions of the underlying coordinate system C) of BBCs where they have influence on each other. One example is to determine when and under what circumstances the output of a component exceeds a certain threshold value, e.g., when the water level on a street constitutes a flood level, caused by heavy rain caused by clogged sewers and street drainage to be inadequate for this situation. It is noteworthy that strict causality can only be determined by exercising all possible combinations of inputs in the system of (A)BBCs—a process that is prohibitively expensive and complex. The methodology of the present disclosure, however, may determine a range of values for which such a detailed evaluation would have to be executed, if strict causality is to be determined. The methodology of the present disclosure may also address the issue of multiple conflicting inputs to a (A)BBC, the flexibility of adding a new (A)BBC to a previously built system and the time synchronization issues between the components.

Black box components (BBCs) herein refer to both black box components and adaptive black box components. FIG. 1 illustrates an example of a system of the present disclosure in one embodiment. In one embodiment of the present disclosure, a system of the present disclosure may include, but not limited to, the following modules: Configuration builder 102, List L of black box components 104, Conflict resolution modules 106, Tessellated analytic field 108, and Simulation choreographer 110. The black box components 104 may be described in a file 112, e.g., an extended markup language (xml) file.

Figure 2:
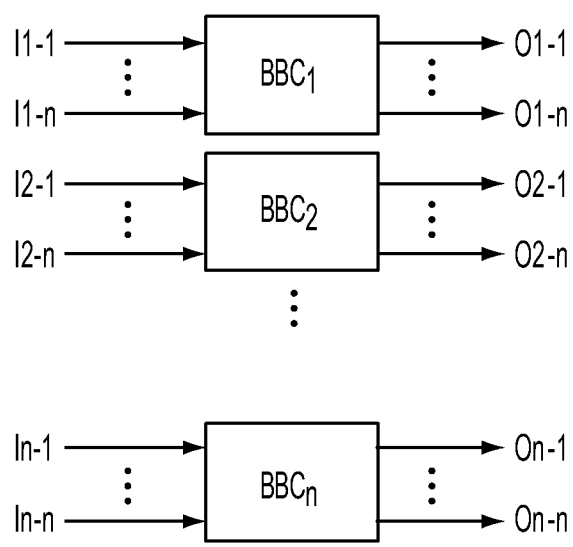
FIG. 2 shows a set of black box components in one embodiment of the present disclosure.

FIG. 2 shows a set of black box components, for instance, shown in FIG. 1 at 104. Each black box component 204 may be labeled BBC with a numbered identifier (1 through n), each component may have zero or more inputs and one output. In one embodiment of the present disclosure, the black box components 204 are described in a file (e.g., 112 in FIG. 1). In one embodiment, such file may be an xml file. Other file types or formats may be used. This description is referred to herein as BBC-specifications. The BBC specifications (e.g., 112 in FIG. 1) describe the input types, possibly including the range of values they accept, and the types of output produced. In addition, the BBC specification (e.g., 112 in FIG. 1) may include initial values for the inputs of the BBC 104.

Referring to FIG. 1, a Semantic Adaptation Layer (SAL) 114 in one embodiment may include a semantic framework (e.g., the W3C Semantic Web) containing canonical forms of the inputs and outputs of the BBCs 104. In addition it may contain a mechanism to map the inputs and outputs of the BBCs into their canonical form and a canonical form back to the appropriate input of BBCs. This conversion can be executed during configuration time and/or during run time. In one embodiment, Looking Glass communicates with the BBC 104 only through using the inputs and outputs as defined in the semantic framework. These inputs and outputs are shown in FIG. 1 as the bi-directional arrow labeled E at 116. An embodiment of a methodology of the present disclosure may use representational state transfer (RESTful) web services, a set of architectural principles, to implement the communication functions between SAL 114 and the other components (e.g., 104, 116, 102).

Figure 3:
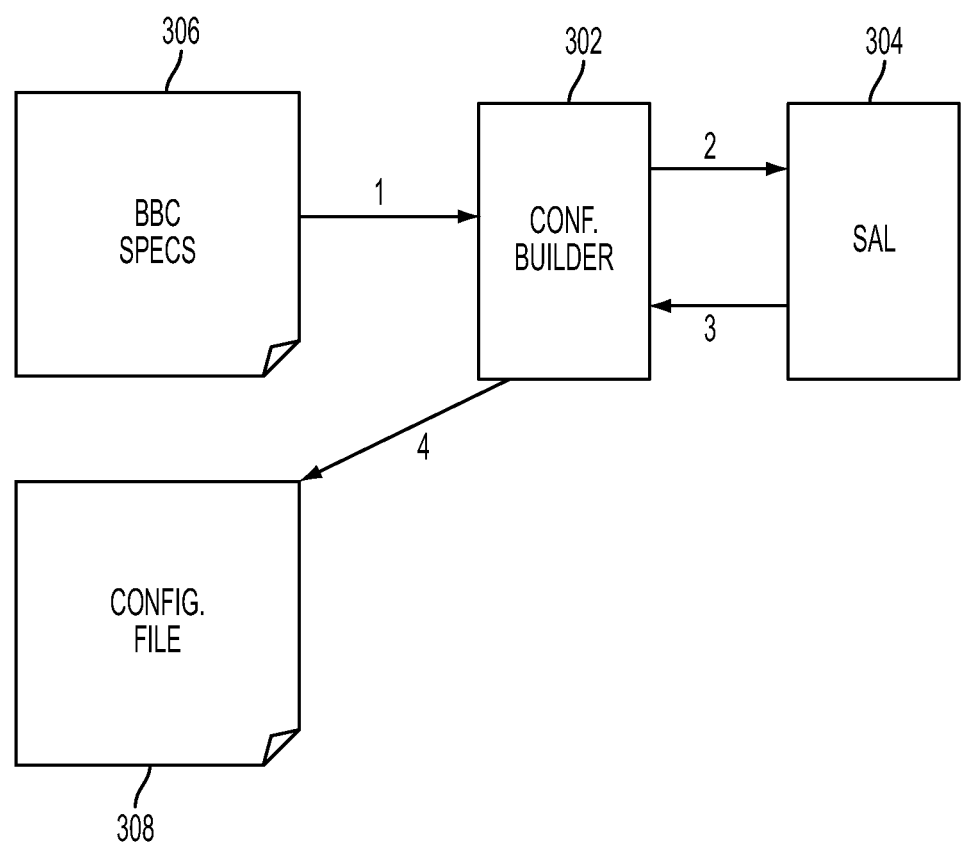
FIG. 3 illustrates a configuration builder in one embodiment of the present disclosure.

A configuration builder 102 takes the BBC specifications 112 as its input and builds a configuration file. FIG. 3 illustrates configuration builder functionality in one embodiment of the present disclosure. A configuration builder takes list L of BBCs as its input and builds a configuration file. A configuration file lists all the BBCs and their inputs and outputs. Other information about the BBCs may be included in the configuration file. The configuration builder then scans the configuration file and flags all the BBCs who have the same output, creating a data structure C defining the BBCs which create the same outputs. Referring to FIG. 3, in one embodiment, the configuration builder 302 may first call the Semantic Adaptation Layer 304 which maps the BBC specifications 306 into canonical BBC specifications by mapping each input to its canonical input (arrows labeled 2 and 3). A notation for a specification file may be XML, which file may be parsed and/or written by XML parsers and writers. A canonical configuration file 308 may be created from the mapping. The methodology of the present disclosure may then scan the canonical configuration file 308 and determine whether two or more BBC's can produce output values for the same ranges. If such BBC's are discovered, a notification or flag is indicated in the configuration file 308, describing the BBC, the affected outputs and their associated value ranges. The set of all such notifications is called a conflict set. A conflict set may be addressed with a conflict resolution module (FIG. 1 at 106).

Figure 4:
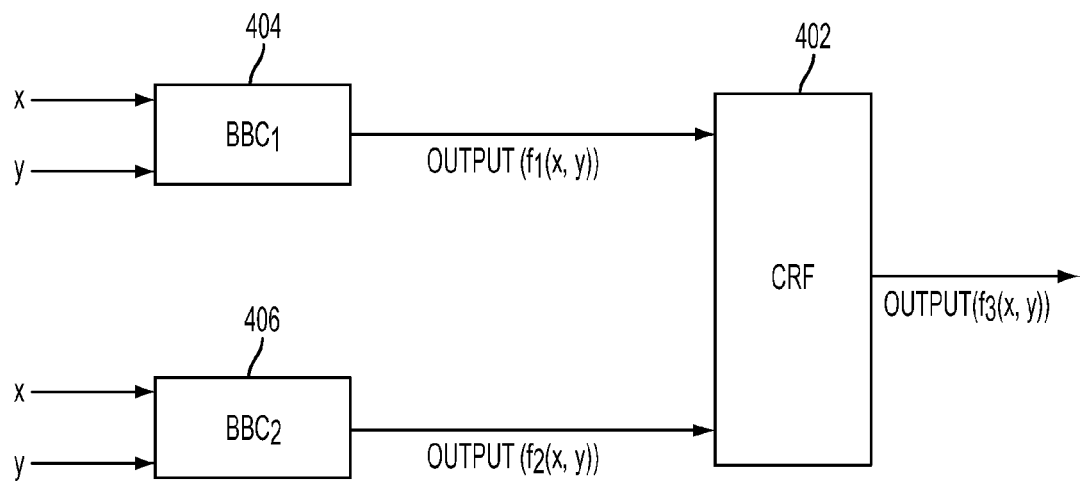
FIG. 4 illustrates a conflict resolution function in one embodiment of the present disclosure.

Referring to FIG. 1, the conflict resolution module 106 takes the conflict set as its input. In general, a conflict is defined if two or more BBC's create the same type of canonical output (but with potentially different values) for the same range of input values as defined by the underlying coordinate system C. FIG. 4 illustrates a conflict resolution function (CRF) 402 in one embodiment of the present disclosure. A conflict resolution function may be implemented as a module that is a device or software system which takes multiple identical (in terms of semantic model) inputs I with values at the same time point, optional other inputs (values at the same time point) and produces a new single derived value for I for the same time point as the input. FIG. 4 shows a conflict resolution function 402 for two BBCs 404 and 406, each with two inputs and one output. The function may be generalized to handle arbitrary number of inputs and outputs. The figure denotes the state at a particular point in time.

$BBC_1$ 404 and $BBC_2$ 406 both emit Output (defined in the semantic adaptation layer) for the same input values of x and y, but as each black box may have different transfer function $f_1$ and $f_2$, the values they emit maybe different. The conflict resolution function (CRF) can be any non-time dependent function that emits Output as shown in FIG. 4. For example, let $BBC_1$ 404 and $BBC_2$ 406 be two temperature gauges, showing the temperature at the same place in Fahrenheit. However, due to differences in the design of the gauges, they each show a different value at a particular time point. The CRF 402 could be as simple as a rule, always picking the output of one of the particular black boxes, or could perform a computation (e.g., the average of the two values) or any other non-time dependent function. A CRF 402 can be specified in the same manner as a BBC and can execute on the hardware and software most opportune. The CRF's may be specified in a CRF configuration file, which may be similar to a system configuration file. In one embodiment, the specification may be described in XML. Other formats or files may be used.

Referring back to FIG. 1, a tessellated field (TF) in one embodiment of the present disclosure is a representation of the coordinates for which the black box system under consideration is defined. The tessellation can be uniform across the field (but is not restricted to be), e.g., an n-dimensional (D) where n denotes any number—for example 2-D—grid, or contain variable shapes across the field. The tessellation can be time varying. For example, the data of the tessellation can be changed or updated as the time passes. The constraint in one embodiment of the present disclosure may be that the parts of a tessellation cannot overlap and have to cover the whole field. A tessellated analytical field (TAF) 108 is a tessellated field where an analytical function can be associated with all or some parts of the tessellation. A conflict resolution module is an example of an analytical function that can be associated. Another example is an aggregation function across multiple parts of a tessellation. With each part of the tessellation a data structure (DS) may be associated. In one embodiment of the present disclosure, such a structure may be a multidimensional map. Each entry in the map (or other data structure) may correspond to a semantic class as defined for the system. For each semantic class, there may be an entry for each BBC which can hold the input(s) and output(s) produced by this BBC for this semantic class. Briefly, items or objects of a semantic class share a common property. The T(A)F 108 in one embodiment may obviate the need for any of the BBCs to have a direct connection to each other, as all necessary data is synchronized, disambiguated and exchanged through the T(A)F 108 with its associated analytical functions. A semantic tessellated field or semantic tessellated analytical field (ST(A)F) is a T(A)F where each tessellation is described by a semantic label. Referring to FIG. 1, a semantic label could be, for example, a text string associated with the whole field or one or more of its parts, in effect mapping between the coordinate system and a string, facilitating the modularity of the system. For example, a rule in a scenario could be specified as "evacuate platform". Here "platform" may be a semantic label, and the mapping between this label and associated coordinates would be specified separately. Hence, if the topography of the "platform" were to change, the rules would not have to be modified. One preferred embodiment may be a Hashmap and the implementation may be internal to the SAL. In the present disclosure, for simplicity, discussion of tessellated field and tessellated analytical field also refers to both the semantic and the non-semantic versions.

The following is an example of an embodiment of a TAF drawn from the subway evacuation scenario described above. In this example, the simulation is carried out in a three dimensional physical space, which is modeled by a Cartesian coordinate system. For simplicity, the present disclosure assumes that the space is in the shape of a cube, and the tessellation of the cube uniform with respect to all its dimensions. Hence each tessellation is also a cube, referred here as a mini-cube. Each mini-cube has a label and coordinates associated with its location in space. Let us assume that the TAF consists of n×n mini-cubes. One preferred embodiment is a hashmap which, for any given point in space, allows for quick lookup of the label of the mini-cube which describes it. In turn, each mini-cube has, in one preferred embodiment, an m×k array associated with it, where m is the sum of the number of models and calculators in the system, and k is the maximum number of different output types, where the maximum is taken over all the models and calculators.

The use of a T(A)F 108 may provide the benefit, as stated above, of obviating the need for direct connections between outputs produced by a BBC and the corresponding inputs to other BBCs: for example, if a value of a specific semantic type S comes from $BBC_1$ into Tessellation $(x_1, x_2, \ldots, x_n)$ at time $T_n$, (where each $x_i$ is an index into one of the dimensions of the tessellation, e.g., there would be $(x_1, x_2, x_3)$ for a 3-dimensional space representation) and if $BBC_2$ has an input that accepts values of type S and is also active in Tessellation $(x_1, x_2, \ldots, x_n)$ at time $T_{n+1}$, then that value may be automatically used as input for $BBC_2$.

Thus in one embodiment of the present disclosure, a tessellated field (TF or TAF) may be represented as a data structure, containing separate data structures (referred to as tessellation data structures for each tessellation (e.g., a mini-cube)). Each tessellation data structures can record values for each output of one or more black boxes as appropriate—depending on the attributes of the outputs. For example, if the tessellated field represents a geographical space, and a black box system produces an output for a particular point in space, this output is recorded in the appropriate tessellation data structures.

The T(A)F refers to the whole space for which the simulation is carried out. In the particular subway example given above, the T(A)F would refer to a space around the subway station, for instance, five miles in the longitudinal and latitudinal direction and one mile in the altitude. Each mini-cube would refer to a much smaller physical space, for instance, a three feet cube space.

In one embodiment of the present disclosure, one T(A)F is provided for a Looking Glass system, and is associated with the coordinates and its boundaries as appropriate for the entire scenario that is to be simulated. It is instantiated during initialization, with its coordinate system, boundaries and tessellation granularity specified in the configuration file associated with the scenario being simulated.

A visualization description generator 118 may use the output of a simulation to derive an abstract description of a scene that can be displayed, for instance, in 2- or 3-dimensions (2-D or 3-D). This abstract description contains the semantic information necessary for a visualization system to generate those 2-D or 3-D displays. In one embodiment, this description may be expressed using xml. An example of the contents of the visualization description may be the location and velocity of an object, as well as other relevant, potentially visualizable, features. One concrete example is a subway: its location, speed, direction, route identifier, and passenger load may all be included in the description. It is up to the visualization subsystem to interpret and display the visualization description.

An example of 2-D visualization subsystem is based on Google™ Maps. It displays the map of the location (e.g., the area around a subway station) and shows the subway cars as icons as well as the location of the people. The location of all artifacts (e.g., subway station, subway cars and people) may be always maintained in three dimensions, but for a two dimensional visualization the altitude information may be ignored. However, at any given point on the map, the user can click and a visualization in three dimensions can be presented. One such visualization may be implemented using a simulator software or tool, for instance, which creates a virtual environment. An example is OpenSim. The choice of a two or three dimensional visualization depends on the particular application using Looking Glass.

A reporting component 120 may provide statistical data regarding details of the simulation. This data can be consumed, for example, by a spreadsheet, statistical package or business intelligence system, or others.

A simulation can produce and report many different types of results: some (not exhaustive) examples are: time and rate of executing a task, the number of people evacuated/killed/injured depending on different initial conditions and events triggered by a user. Any of the values associated with the simulation, both individually (as a function of time), and in the aggregate can be reported.

Simulation

Simulation in one embodiment of the present disclosure may be a modified discrete time step simulation and may be executed by the simulation choreographer 110 (FIG. 1). The following describes the simulation in one embodiment of the present disclosure. The time step $\Sigma t$ is variable. At time $T_0$ (the beginning time of the simulation) a data structure DS is initialized with appropriate values. The DS of TAF or TF describes the black box system in consideration (being simulated) and includes BBC specifications and any analytic functions associated with the BBCs in the black box system. At every time step, the analytical functions associated with TAF may be executed. At the subsequent time step $\Sigma t$ the input values for each BBC are taken from the DS, each BBC computes then its new output values and a global update of all data structures in the TAF is performed. Within the just described simulation, the BBCs do not have to know anything about each other, there is no complex specification and connecting of the components. In addition, another BBC can be added into the system.

The methodology of the present disclosure in one embodiment may utilize an event driven simulation executed within a time interval. For example, let $\Delta t$ be the longest time after time t when all the values for time point t have been computed by all the BBCs. Let $t_2$ be time $t+\Delta t$. At time $t_2$ input and output values for all BBCs are pulled (or pushed) for time $t_2 - \Delta t$ and $t_2$ and an event driven simulation is executed for this time interval, if any BBC has an event queue. Such technique may overcome a possible loss of accuracy due to the fixed time stamp with each discrete time step simulation, for instance, applicable both to BBCs which produce time continuous outputs and to those with time discrete output. Such technique of the present disclosure further may address synchronization issues encountered when each BBC executes to its internal clock and synchronization to a global system clock introduces delays. In one aspect, Looking Glass imposes no constraints on the models which can contribute to the simulation.

A system incorporating one or more black boxes may be simulated according to the above-described methodology, for example, for a specified time span based on some starting assumptions (inputs) and the outcomes (outputs) are observed. In case a transfer function is known for a component, causality for cascading events maybe computed. The methodology of the present disclosure in one embodiment provides for detecting ranges of values for variables which indicate causality of cascading events to limit the scope of causality investigation to be performed within a black box system, e.g., within an adaptive black box system. The simulation of the present disclosure may also take dynamic data into account—that is, data which can be modified during the simulation. The methodology of the present disclosure may provide for a plug-and-play (adaptive) black box system execution or simulation system, which may take dynamic data into account.

The present disclosure may provide a plug-and-play system for one or more black box components. For instance, in one aspect, the present disclosure provides a plug-and-play system of two or more black box components whose transfer functions are defined over a common coordinate system and time, without the need for direct connections between the black box components. In one embodiment, for example, the black box components communicate only through the (semantic) tessellated field, for instance, a semantic tessellated analytical field.

In another embodiment, the plug-and-play system applies to two or more adaptive black box components whose transfer functions are defined over a common coordinate system and time without the need for direct connections between the adaptive black box components. The adaptive black box components communicate only through the (semantic) tessellated field in one embodiment of the present disclosure, for instance, a semantic tessellated analytical field.

Yet in another embodiment, data associated with adaptive black box components can be modified during execution. Still in another embodiment, the time synchronization between the (adaptive) black box components is achieved solely through the T(A)F. Such system may be re-used in multiple scenarios where input data to the (adaptive) black box components can change.

Via the system of the present disclosure, one can discover anomalous behavior in a (adaptive) black box component system and issue (customized) alerts. For instance, reports may be generated. In another embodiment, dashboards or other user interfaces may present such alerts or other information.

Conflicting values may be resolved through static and run time analysis of the value sources. The conflict resolution mechanism in one embodiment of the present disclosure may be a rule based evaluation of sources. The conflict resolution mechanism in another embodiment of the present disclosure may be a programmatic evaluation of sources.

Figure 5:
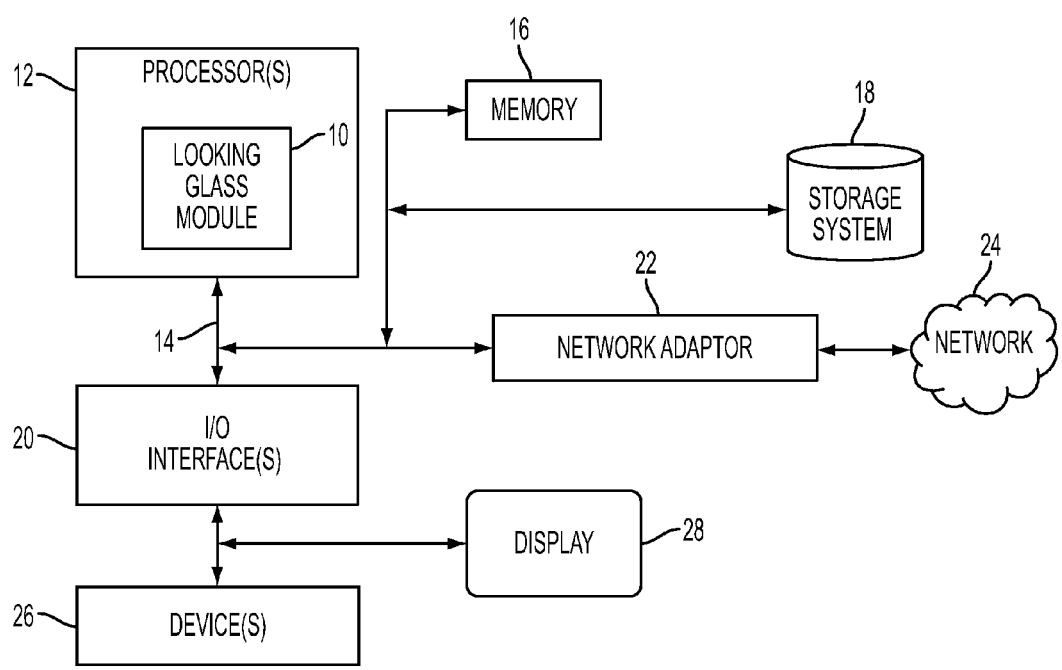
FIG. 5 illustrates a schematic of an example computer or processing system that may implement the looking glass system in one embodiment of the present disclosure.

FIG. 5 illustrates a schematic of an example computer or processing system that may implement the looking glass system in one embodiment of the present disclosure. The computer system is only one example of a suitable processing system and is not intended to suggest any limitation as to the scope of use or functionality of embodiments of the methodology described herein. The processing system shown may be operational with numerous other general purpose or special purpose computing system environments or configurations. Examples of well-known computing systems, environments, and/or configurations that may be suitable for use with the processing system shown in FIG. 5 may include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

The computer system may be described in the general context of computer system executable instructions, such as program modules, being executed by a computer system. Generally, program modules may include routines, programs, objects, components, logic, data structures, and so on that perform particular tasks or implement particular abstract data types. The computer system may be practiced in distributed cloud computing environments where tasks are performed by remote processing devices that are linked through a communications network. In a distributed cloud computing environment, program modules may be located in both local and remote computer system storage media including memory storage devices.

The components of computer system may include, but are not limited to, one or more processors or processing units 12, a system memory 16, and a bus 14 that couples various system components including system memory 16 to processor 12. The processor 12 may include one or more components or modules 10 of the looking glass system that performs the methods described herein. The module 10 may be programmed into the integrated circuits of the processor 12, or loaded from memory 16, storage device 18, or network 24 or combinations thereof.

Bus 14 may represent one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Computer system may include a variety of computer system readable media. Such media may be any available media that is accessible by computer system, and it may include both volatile and non-volatile media, removable and non-removable media.

System memory 16 can include computer system readable media in the form of volatile memory, such as random access memory (RAM) and/or cache memory or others. Computer system may further include other removable/non-removable, volatile/non-volatile computer system storage media. By way of example only, storage system 18 can be provided for reading from and writing to a non-removable, non-volatile magnetic media (e.g., a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 14 by one or more data media interfaces.

Computer system may also communicate with one or more external devices 26 such as a keyboard, a pointing device, a display 28, etc.; one or more devices that enable a user to interact with computer system; and/or any devices (e.g., network card, modem, etc.) that enable computer system to communicate with one or more other computing devices. Such communication can occur via Input/Output (I/O) interfaces 20.

Still yet, computer system can communicate with one or more networks 24 such as a local area network (LAN), a general wide area network (WAN), and/or a public network (e.g., the Internet) via network adapter 22. As depicted, network adapter 22 communicates with the other components of computer system via bus 14. It should be understood that although not shown, other hardware and/or software components could be used in conjunction with computer system. Examples include, but are not limited to: microcode, device drivers, redundant processing units, external disk drive arrays, RAID systems, tape drives, and data archival storage systems, etc.

Figure 6A:
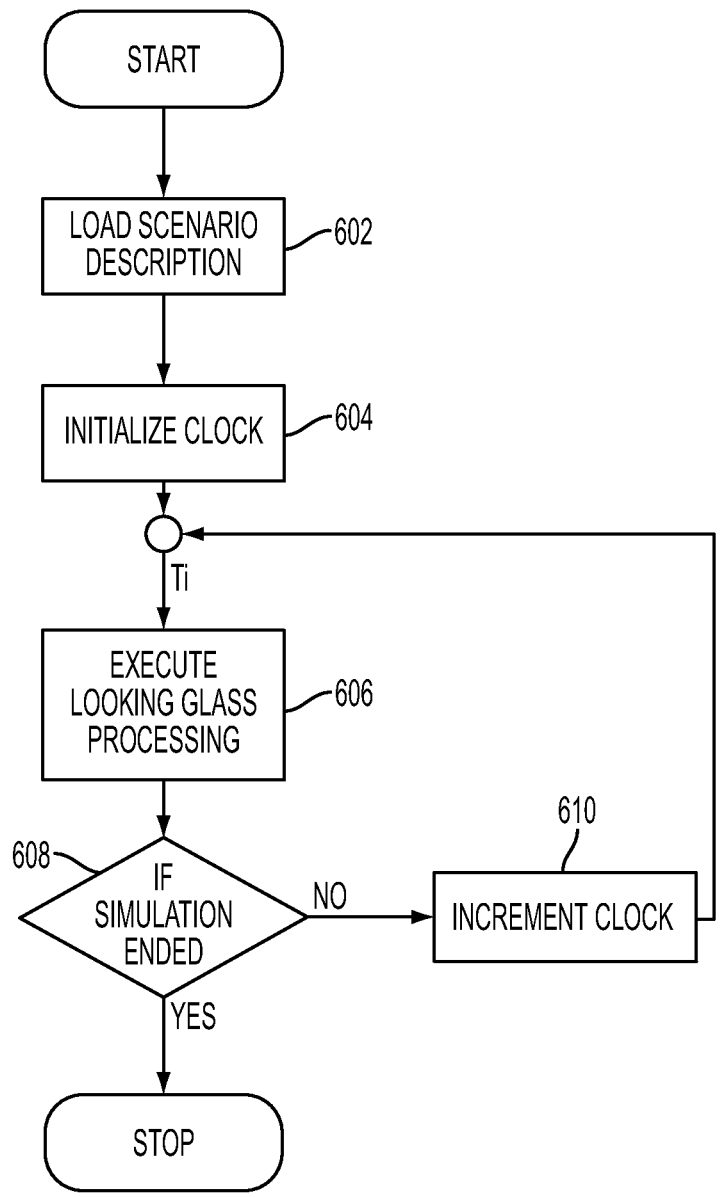
FIGS. 6A and 6B are flow diagrams illustrating a methodology of the present disclosure in one embodiment.
Figure 6B:
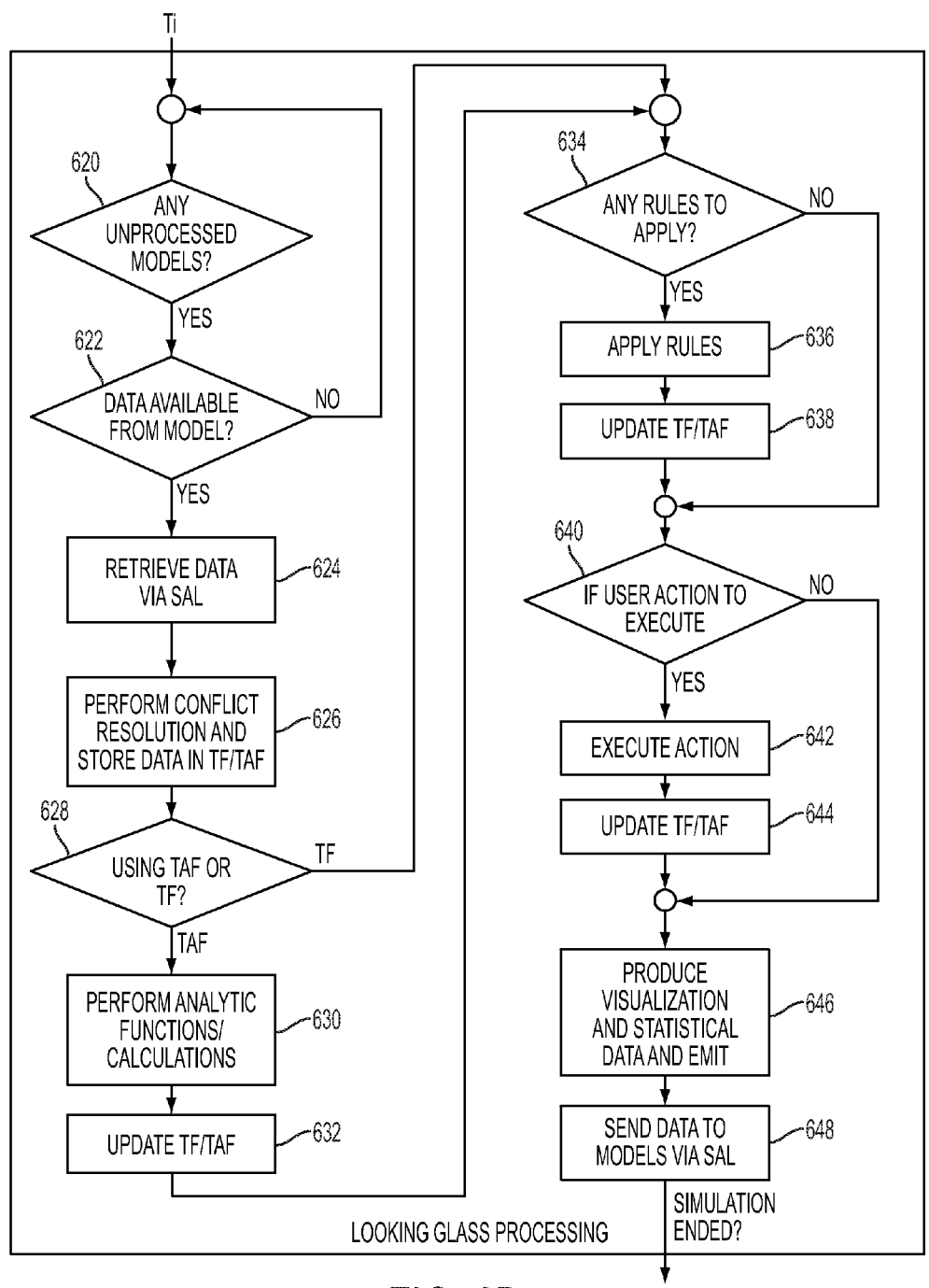

FIGS. 6A and 6B illustrate a flow diagram illustrating a method of the present disclosure in one embodiment. FIG. 6A shows a flow of control for a simulator modeling cascading events in one embodiment of the present disclosure. At 602, a scenario description is loaded into the system, describing the models, data sources, and other relevant information. For instance, black box models, their inputs and outputs and other information may be loaded. The loading may include the configuration builder building a configuration file, the conflict resolution module resolving conflicts, and updating the information into the tessellated analytic field (TAF).

At 604, the system's clock is then initialized, for use by any time-dependent subsystems. The time ($T_i$) represented by the clock is passed along to a processing (FIG. 6B) for simulation. At 606, simulation processing is executed. At 608, if, at the end of this step the simulation has not been concluded (e.g., by user request), the clock is incremented at 610 and another cycle of processing is performed.

FIG. 6B shows a processing control flow for simulating a model of cascading events in one embodiment of the present disclosure. Each model may be queried for its current data for time $T_i$ via the Semantic Adaptation Layer (SAL). For instance, a simulator choreographer (110, FIG. 1) may determine whether there are any unprocessed black box models at 620 and whether data is available from the one or more unprocessed black box models for time $T_i$ at 622, by querying each black box component that is running.

If it is determined that there are data available from a model at 622, the data is retrieved at 624 from the models via the SAL. If no data is available, the control returns and waits until data from a model or other data source becomes available. At 626, conflict resolution may be performed as this data is placed into the T(A)F. At 628, it is determined whether TAF or TF is being used. If the system is configured such that it is using a TAF (vs. TF), associated analytic functions are performed at 630 and the data resulting from performing the associated analytic functions is placed into the TAF at 632.

At 634, it is determined whether there are any rules to be applied. At 636, if there are rules to apply, those rules are then applied. The rules are associated with one or more black box component models being executed. The rules advance the scenario being simulated, for instance, based on the data detected as 622 and/or the one or more analytic functions performed at 630. Applying the rules may change the conditions and/or other circumstances in the system being simulated, unfolding the state of the situation over time.

At 638, and any impact on the T(A)F is recorded in T(A)F. An example of such impact may be from a rule that specifies that a bomb is detonated at a specific location if a person enters that location: the portion of the T(A)F that is referenced (corresponds to this location) would be adjusted to contain the exploding bomb.

Once these steps are completed, at 640, it is determined whether there are one or more user actions to execute. For instance, the modeling of the cascading events from the black box components may be simulated via a user interface (or a graphical user interface system), allowing a user running the simulation to observe the process. Thus, utilizing the user interface, the user may interactively during the simulation provide the user input, such as causing an event to occur during the simulation, changing values to the simulation, and others. The user input or changes (user action) may change the data associated with the one or more black box components that are being executed.

If it is determined that there are one or more user actions to execute, the one or more user actions are executed at 642, processing any user interactions. At 644, the results of user interaction, user action execution are stored back into the T(A)F. Examples of user actions may include the stopping of a train, adding or removing people, or detonation of a bomb.

At 646, the contents of the T(A)F may be used to generate the visualization description and statistical information, which may be then emitted to their clients (e.g., display software, database, etc.). Such client modules may then present the results to users.

At 648, the results in the T(A)F are sent back to any models that expect them, for example, via SAL, and an indication of whether simulation should continue is indicated. In one embodiment, the simulation may end when a user specifically ends the simulation. The simulation may end if a time duration for simulation has expired. The simulation may end based on other criteria.

The results stored in T(A)F may in turn trigger one or more other black box components to be executed, for instance, in the next iteration of the simulation (e.g., steps shown in FIG. 6B). Hence, in one embodiment of the present disclosure cascading events may be simulated among a plurality of black box components plugged into a system of the present disclosure utilizing the T(A)F.

It is noted that the coordinate system of the simulation in the subway example given above referred to a geographical coordinate system (i.e., spatial). However, in other embodiments, the system and methodology of the present disclosure may be applicable to other coordinate systems, for instance, depending on the scenario and/or situation to be simulated.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be utilized. The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages, a scripting language such as Perl, VBS or similar languages, and/or functional languages such as Lisp and ML and logic-oriented languages such as Prolog. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The computer program product may comprise all the respective features enabling the implementation of the methodology described herein, and which—when loaded in a computer system—is able to carry out the methods. Computer program, software program, program, or software, in the present context means any expression, in any language, code or notation, of a set of instructions intended to cause a system having an information processing capability to perform a particular function either directly or after either or both of the following: (a) conversion to another language, code or notation; and/or (b) reproduction in a different material form.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements, if any, in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

Various aspects of the present disclosure may be embodied as a program, software, or computer instructions embodied in a computer or machine usable or readable medium, which causes the computer or machine to perform the steps of the method when executed on the computer, processor, and/or machine. A program storage device readable by a machine, tangibly embodying a program of instructions executable by the machine to perform various functionalities and methods described in the present disclosure is also provided.

The system and method of the present disclosure may be implemented and run on a general-purpose computer or special-purpose computer system. The terms "computer system" and "computer network" as may be used in the present application may include a variety of combinations of fixed and/or portable computer hardware, software, peripherals, and storage devices. The computer system may include a plurality of individual components that are networked or otherwise linked to perform collaboratively, or may include one or more stand-alone components. The hardware and software components of the computer system of the present application may include and may be included within fixed and portable devices such as desktop, laptop, and/or server. A module may be a component of a device, software, program, or system that implements some "functionality", which can be embodied as software, hardware, firmware, electronic circuitry, or etc.

The embodiments described above are illustrative examples and it should not be construed that the present invention is limited to these particular embodiments. Thus, various changes and modifications may be effected by one skilled in the art without departing from the spirit or scope of the invention as defined in the appended claims.

We claim:

1. A hybrid simulation system for modeling cascading events within a black box system, comprising:
   a processor;
   a tessellated field representing coordinates for the black box system and operable to allow a plurality of black box components to execute on the processor and communicate without needing a direct connection between the black box components; and
   a choreographer module operable to execute on the processor and further operable to manage
   and synchronize running of the plurality of black box components via the tessellated field over time, the black box components having transfer functions defined over a common coordinate system and time.

2. The system of claim 1, wherein the plurality of black box components are pluggable into the system and playable.

3. The system of claim 1, wherein the tessellated field includes tessellated analytical field.

4. The system of claim 1, wherein the black box components communicate with one another through a tessellated field only.

5. The system of claim 1, wherein one or more of the plurality of black box components are adaptive black box components.

6. The system of claim 5, wherein data associated with one or more of the adaptive black box components can be modified during execution.

7. The system of claim 1, wherein time synchronization between the black box components is achieved solely through the tessellated field.

8. The system of claim 1, wherein the system is re-used in multiple scenarios wherein input data to the black box components change.

9. The system of claim 1, wherein anomalous behavior in the one or more of the plurality of black box components is discovered and issued as alerts.

10. The system of claim 1, wherein visualization semantics are output for generating visualization of the interactions of the plurality of black box components via a graphical user interface.

11. The system of claim 1, wherein the tessellated field is initialized with data associated with the black box system, including specification of the plurality of black box components and a scenario the black box system is simulating.

12. The system of claim 11, wherein the tessellated field is updated with data associated with additional one or more black box components that are plugged into the system.

13. A non-transitory computer readable storage medium storing a program of instructions executable by a machine to perform a method of modeling cascading events within a black box system, comprising:
   receiving a scenario description, the scenario description including coordinates of the black box system, specification of a plurality of black box components associated with the black box system;
   building a tessellated field associated with the black box system based on the received scenario description, the tessellated field representing coordinates for the black box system;
   running a simulation scenario by executing the plurality of black box components over a simulation time period, the black box components having transfer functions defined over a common coordinate system and time, the black box components communicating only through the tessellated field without needing a direct connection between the black box components; and
   updating the tessellated field with results of the simulation.

14. The non-transitory computer readable storage medium of claim 13, further including:
   generating visualization and statistical data based on the updated tessellated field, wherein the generated visualization and statistical data is transmitted to a graphical user interface module for presentation to a user.

15. The non-transitory computer readable storage medium of claim 13, wherein the tessellated field is updated over the simulation time period and wherein one or more of the black box components are executed using the updated tessellated field over the simulation time period, the tessellated field being further updated in accordance with output generated by the plurality of black box components over the simulation time period.

16. A non-transitory computer readable storage medium storing a program of instructions executable by a machine to perform a method of modeling cascading events within a black box system, comprising:
   receiving a scenario description;
   configuring a tessellated field representing coordinates of the black box system based on the scenario description and specifications of a plurality of black box components associated with the black box system; and
   running a simulation scenario by executing the plurality of black box components, the black box components having transfer functions defined over a common coordinate system and time, the black box components communicating only through the tessellated field without needing a direct connection between the black box components, the running a simulation scenario comprising at least,
   initializing a clock to time T;
   retrieving data available from one or more of the plurality of black box components;
   resolving conflict, if any, in the received data;
   storing the data in the tessellated field;
   performing one or more analytic functions, if any, associated with the one or more of the plurality of black box components from which the data is retrieved;
   updating the tessellated field with one or more results of the performed one or more analytic functions;
   applying one or more rules associated with the one or more of the plurality of black box components from which the data is retrieved;
   updating the tessellated field with one or more results of the applying of the one or more rules;
   executing one or more user actions, if any, received from a user via a computer user interface module;
   updating the tessellated field with one or more results of the executing of the one or more user actions;
   incrementing time T by a time unit; and
   repeating the steps of retrieving, resolving, storing, performing, updating, applying, updating, executing, updating and incrementing until simulation is ended.

17. The non-transitory computer readable storage medium of claim 16, wherein the tessellated field is multidimensional spatial coordinate representation of the scenario being simulated, the tessellated field including a plurality of tessellations, each of the plurality of the tessellations representing a part of the spatial coordinate covered by the tessellated field, wherein one or more of the tessellations are associated with a multidimensional geographical map, one or more black box components, or combinations thereof.

* * * * *